(12) United States Patent
Bald et al.

(10) Patent No.: US 6,515,484 B1
(45) Date of Patent: Feb. 4, 2003

(54) ELECTRICAL TEST INSTRUMENT HAVING AN IMPROVED OPERATOR INTERFACE

(75) Inventors: Roger A. Bald, Round Lake Beach, IL (US); Pin-Yi Chen, Taipei (TW)

(73) Assignee: Associated Research, Inc., Lake Forest, IL (US)

( * ) Notice: Subject to any disclaimer, the term of this patent is extended or adjusted under 35 U.S.C. 154(b) by 144 days.

(21) Appl. No.: 09/699,331

(22) Filed: Oct. 31, 2000

(51) Int. Cl.[7] .......................... H01H 31/12; G09G 5/00; G06F 19/00
(52) U.S. Cl. ...................... 324/551; 324/555; 324/73.1; 345/840; 702/120
(58) Field of Search ................................ 324/551, 555, 324/544, 545, 73.1, 510, 511; 702/120, 119, 121; 345/771, 965, 810, 840, 841

(56) References Cited

U.S. PATENT DOCUMENTS

| | | | |
|---|---|---|---|
| 4,488,299 A | * 12/1984 | Fellhauer et al. | 324/73.1 |
| 4,949,290 A | * 8/1990 | Pike et al. | 324/76.11 |
| 5,056,059 A | 10/1991 | Tivig et al. | |
| 5,101,160 A | 3/1992 | Barjonnet et al. | |
| 5,321,420 A | 6/1994 | Rezek et al. | |
| 5,675,754 A | 10/1997 | King et al. | |
| 5,724,273 A | * 3/1998 | Desgrousilliers et al. | 702/120 |
| 5,808,920 A | 9/1998 | Zwan et al. | |
| 5,861,882 A | 1/1999 | Sprenger et al. | |
| 6,011,398 A | 1/2000 | Bald et al. | |
| 6,054,865 A | * 4/2000 | Bald et al. | 324/545 |
| 6,064,372 A | * 5/2000 | Kahkoska | 345/173 |
| 6,246,408 B1 | * 6/2001 | Alexander | 345/440 |

OTHER PUBLICATIONS

Richards, James, *Choosing a hipot tester depends on the level of test*, Electronic Products, Jul. 1999.
*Electrical Safety Testing Reference Guide*, QuadTech., Inc., 1998, pps. 1–42.
Cirris, Cable/Harness Testing Made Easty™, Signature Touch 1, Quick View, 1999.
Vitrek model 944i AC & DC Hipot Plus, TRI, 2000.
Hubbell® Hipotronics®, 300 Series AC/DC Hipot Insulation Tester & Megohmmeter, 1998.
QuadTech, Guardian 6200 Production Safety Analyzer, 2000.
Rod–L Electronics, Inc., Leakage Current Test Instrument, 2000.
High Voltage, Portable AC Hipot Tester, PFT Series, 2000.

* cited by examiner

*Primary Examiner*—N. Le
*Assistant Examiner*—Anjan K. Deb
(74) *Attorney, Agent, or Firm*—Bacon & Thomas

(57) ABSTRACT

An electrical test instrument includes an improved operator interface capable of including the following features: (i) a pause/prompt feature enable prompts to be displayed during a pause, in order to facilitate operator reconfiguration of the instrument during testing; (ii) an autocalibration alert function to alert the operator that the instrument requires calibration; (iii) a security function that enables the operator to select from among a plurality of security level options; and (iv) a more flexible menu structure that enables set-up of additional tests performed by plug-in test instrument modules.

17 Claims, 9 Drawing Sheets

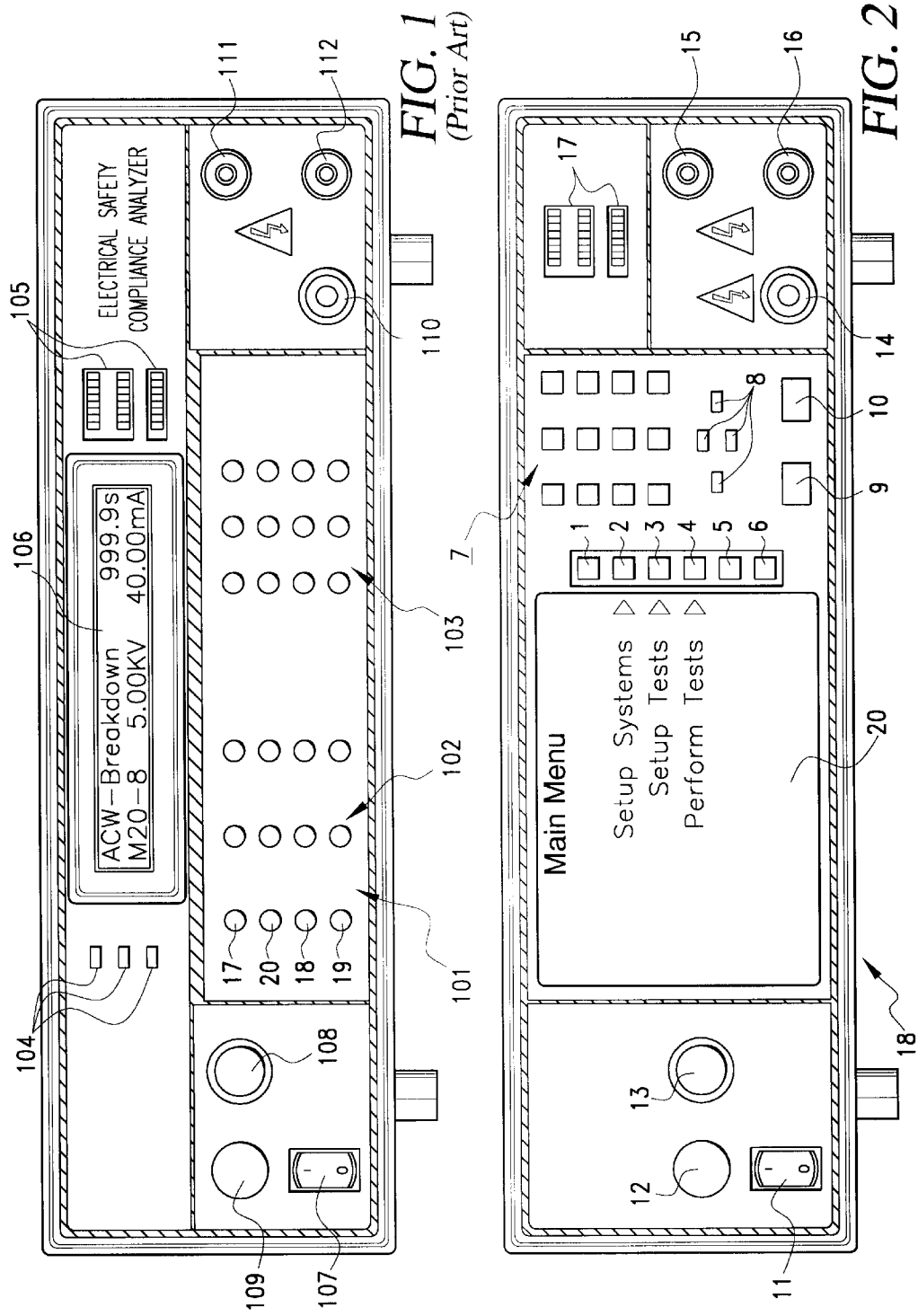

FIG.7(e)

Line Leakage

| | | |
|---|---|---|
| HI-Limit | xxxxuA | |
| LO-Limit | xxxxuA | |
| Delay Time | xxx.xs | |

Reverse ON △
Neutral Closed △
Ground Closed △
Measuring Device UL 544 △
Probe Ground to Line △
Defaults △

Range :
HI - Limit
0 - 6000uA

Run Test

| | | |
|---|---|---|
| Volt-HI | xxxxV | Power-HI xxxxxW |
| Volt-LO | xxxxV | Power-LO xxxxxW |
| Current-HI | xxx.xA | PF-HI x.xxx |
| Current-LO | xxx.xA | PF-LO x.xxx |
| Dwell Time | xxx.xs | |
| Delay Time | xxx.xs | |
| Leakage-HI | xxx.xuA | |
| Leakage-LO | xxx.xuA | |

Defaults △

Range :
Volt-HI
0 - 277V

Perform Tests

| | | | |
|---|---|---|---|
| 1 | LLT 120V 5.0s | Settings 500uA 100uA | |
| 2 | ACW 5000V 20.0s | Settings 97.32mA 2.00mA | |
| 3 | DCW 1000V 10.0s | Settings 500uA 100uA | |
| 4 | IR 500V 10.0s | Settings 800MΩ 200MΩ | |
| 5 | GND 25A 1.0s | Settings 600mΩ 100mΩ | |

Load File △
Single Step  OFF △
Fail Stop  OFF △
Results △

File Name : ARITEST 3
△ Move up  ▽ Move down
▽ Page up  △ Page down

To initiate this test, press the TEST button.

FIG.8(b)

Perform Tests

| | | |
|---|---|---|
| 1 | LLT 120V 5.0s | Pass 432uA |
| 2 | ACW 5000V 20.0s | Pass 75.32mA |
| 3 | DCW 1000V 10.0s | Lo-Limit 0.0uA |
| 4 | IR 500V 10.0s | Pass 468MΩ |
| 5 | GND 25A 1.0s | Hi-Limit >600mΩ |

FAIL
STEP TEST FAILURE
3  DCW  Lo-Limit
5  GND  Hi-Limit

File Name : ARITEST 3
▽ Page up  △ Page down

ELECTRICAL TEST INSTRUMENT HAVING AN IMPROVED OPERATOR INTERFACE

BACKGROUND OF THE INVENTION

1. Field of the Invention

The present invention relates to electrical test equipment, and in particular to an electrical safety compliance test instrument having an improved operator interface.

The electrical safety compliance test instrument of the invention includes a number of improvements designed to simplifying set-up and testing procedures, in order to reduce the risk of operator error and to ensure accurate test results. The improvements utilize a softkey controlled display screen capable of displaying a complete safety test instruction set or set of test parameters, and/or a complete set of test results, to provide the following interactive display functions or features:

- a pause/prompt function that causes prompts to be displayed during a pause, in order to facilitate operator reconfiguration of the equipment during testing;
- an autocalibration alert function that alerts the operator when the instrument is due for scheduled calibration; and
- a security function that enables the operator to select from among a plurality of security level options
- a more flexible menu structure that enables set-up of additional tests performed by plug-in test instrument modules.

2. Description of Related Art

Electrical safety compliance test equipment has become increasingly sophisticated or complex, both to meet the requirements of different agencies responsible for safety compliance testing, and also because of the availability of improved microprocessor based controllers which enable a single tester to perform multiple tests based on pre-programmed instruction sets. As a result, demands on the operator of the equipment have also increased. In order to perform the multiple tests that might be required for a particular product, the operator must not only correctly program all of the numerous test parameters for each of multiple steps, but also must, during testing, correctly connect and then reconfigure the connections between the test equipment and the device undergoing the tests. Often, the same equipment is used to test different types of products, each requiring different sets of tests or testing procedures, or to test products for shipment to different countries with varying test requirements. Because many of the tests are performed at voltages in excess of 1000 volts, incorrect connections can present a serious safety hazard to the operator or bystanders, while improper test set-up or interpretation of the test results can result in the shipment of defective products and hazards to consumers.

An example of the trend toward greater test instrument sophistication is the multiple function dielectric withstand tester described in U.S. Pat. No. 6,054,865, assigned to Associated Research, Inc. of Lake Bluff, Ill., which is capable of performing at least five different types of tests. The tests, which include high voltage AC and DC dielectric withstand tests, insulation resistance tests, AC ground bond tests, and DC continuity tests, all require different connections between the tester and the device under test, and therefore a highly skilled operator. In addition, the Associated Research multiple function dielectric withstand tester has the capability of being linked to additional safety testers of different types, further complicating test set-up and interpretation.

Another example of a tester capable of performing different types of tests with multiple test configurations is the line leakage tester disclosed in U.S. Pat. No. 6,011,398, also assigned to Associated Research, Inc. This tester has the capability of running multiple tests to simulate different potential hazards that might be faced by a user of the product being tested, and like the Associated Research multiple function dielectric withstand tester, also includes external link capabilities.

To simplify test set-up and minimize risk of operator error, both of the Associated Research testers provide an integrated menu-driven user interface for setting-up multiple pre-programmed test sequences. For example, the operator interface of the electrical safety compliance test instrument illustrated in FIG. 1, which is identical to the instrument illustrated U.S. Pat. No. 6,054,865, includes a keypad 1 made up of a plurality of pre-assigned function keys 2 and a numeric keypad 3, various LED indicators 4,5 and an LCD display screen 6 capable of displaying interactive menus through which test parameters such as voltage and current levels, test duration, and ramping times, may be preprogrammed or set for each of the types of tests that the instrument is capable of carrying out, as well as an on/off switch 7, start button 8, reset button 9. Also included on the front panel of the illustrated multifunction dielectric withstand test instrument are respective high voltage, current and return jacks 10,11,12.

By providing integrated, menu driven operator interfaces, the test instruments described in the Associated Research patents, including the test instrument illustrated in FIG. 1, reduce the chance of operator error and thereby offer significant safety and convenience advantages over conventional non-interactive instrument displays. Nevertheless, the operator interfaces of the two testers, as well as those of other safety compliance test instruments, still place relatively high demands on the operators, with consequent hazards to both the operator and end-users of the product being tested.

In order to eliminate any possible source of operator error, it has been proposed in U.S. Pat. No. 5,861,882 to completely automate the process of test configuration, using software-based switches to switch between multiple test instruments and an icon based interactive test set-up and control display. While this approach has the advantage of ease-of-use, the icon based control is designed to be implemented on a central computer linked to separate test instruments and is not suitable for implementation through a display integrated into the front panel of a single instrument, the separate test instruments being connected via a common bus to the central computer and via a single pre-configured interface to the device under test. The configuration of the interface to the device under test is not specifically described in U.S. Pat. No. 5,861,882, but rather is presumed to be constant, with no provision for automatic switching or re-connection of test probes, or for programming of individual test instruments to cooperate with the main control program and accept the appropriate test commands. To the contrary, as explained in the abstract of U.S. Pat. No. 5,861,882, the test instrument of this patent seeks to dynamically reconfigure the test set up for different tests without hand rewiring or loading of other test programs, thereby both increasing the complexity of the system and in practice greatly limiting the number of different types of tests that can be performed with a particular instrument. This lack of provision for reconfiguration of instrument to device under test connections makes the system described in this patent impractical for many safety compliance testing applications.

Unlike the operator interface described in U.S. Pat. No. 5,861,882, which is designed to control separate test instruments connected by a common bus to a pre-configured connection to the device under test, the present invention concerns an operator interface integrated into a single multiple function test instrument. In the context of single instrument operator interfaces, it is of course known to provide displays that provide multiple lines of text as well as graphics, but none of these single-instrument displays address the above-described concerns related to electrical safety compliance testing.

An example of a prior text/graphic display capable of displaying large amounts of information is the medical diagnostic instrument display disclosed in U.S. Pat. No. 5,056,059. While the display screen disclosed in this patent could be included in a multiple function safety compliance test instrument, however, the software that controls the display is not suitable for use in a safety compliance tester because of the limited number of probe configurations and types of tests that can be controlled by the instrument, and the higher level of training required to operate the instrument.

Another type of instrument with an operator interface that utilizes a sophisticated text/graphics display is the communications line test device disclosed in U.S. Pat. No. 5,808,920. The test device disclosed in U.S. Pat. No. 5,808,920 is arranged to enable input and interpretation of digital communications protocols, however, and therefore does not require the multiple test lead configurations or high voltages of safety compliance test instruments.

Also of interest by way of background are voltage-current multimeter displays, such as the one disclosed in U.S. Pat. No. 6,064,372, which eliminates the need for multiple buttons by including a touch screen, and oscilloscope displays, such as the one described in U.S. Pat. No. 5,321,420, which is of particular interest because it includes a softkey control rather than a scrolling or purely graphical display. While multimeters and oscilloscopes both perform numerous types of electrical tests, however, neither utilizes pre-programmed test sequences of the type included in the above-described safety compliance testers, and thus the operator interfaces used in such electrical testers are not suitable for use in safety compliance testers.

Those skilled in the art will appreciate that the displays disclosed in the above-mentioned patents are both more sophisticated than those of conventional safety compliance testers, and yet are not suitable for use in such testers because of the lack of provision for pre-programmed test set-ups, and other features unique to safety compliance testing. The present invention, on the other hand, occupies a middle ground between the multiple instrument graphical user interface described in U.S. Pat. No. 5,861,882 and the scrolling displays integrated into the Associated Research test instruments disclosed in U.S. Pat. Nos. 6,054,865 and 6,011,398, or the test instrument disclosed in U.S. Pat. No. 5,101,160, which like the displays described in the Associated Research patents, includes a scrolling test mode alphanumeric display (col. 7, lines 7–12) and a code key lockout feature (col. 7, lines 47–50). In particular, without requiring a separate computer and graphical user interface as in U.S. Pat. No. 5,861,882, the present invention address problems unique to electrical safety testing that cannot be addressed by the limited displays of conventional instruments, including the following:

Because of the limited size of the conventional safety compliance test instrument display screen, only one step or set of parameters can be presented at one time, making it difficult and relatively time consuming to input and verify an entire test setup, and to read the results of a test.

Although a number of currently available testers provide for pre-programming of multiple test set-ups, it is still necessary to manually reconfigure connections to the device under test, during which improper connections can occur.

Improper test results and possible hazards to the operator can result from failure to calibrate the instrument regularly.

While prior safety compliance test instruments include lockout features for preventing unauthorized use of the instrument, the conventional lock-out arrangements lack the flexibility to permit access to selected test set-ups but not others, or to limit changes to certain parameters or features.

In summary, despite the importance of electrical safety compliance testing and the availability, in other contexts of suitable displays, no safety compliance instrument to date has addressed such concerns as the need to provide operator prompts that ensure proper manual reconfiguration by the operator of test set-ups during testing, timely calibration of the instrument, or the ability to select from among a plurality of security level options. What is needed is an operator interface including a display suitable for integration into a safety compliance test instrument that provides clear instructions on carrying out a test, including instructions on reconfiguration of the connections to the device under test, as necessary, and that ensures that the instrument is properly calibrated and ensures access only to operators qualified to perform particular tests greatly enhances the safety of the testers.

SUMMARY OF THE INVENTION

It is a accordingly a first objective of the invention to provide a safety compliance test instrument having an improved operator interface that minimizes risk of operator error during set-up and running of multiple tests, and of errors in reading or interpreting test results.

It is a second objective of the invention to provide a safety compliance test instrument having an improved display enabling verification at a glance of entire test sequences, sets of test parameters, and test results.

It is a third objective of the invention to provide a safety compliance test instrument having an improved display that minimizes risk of operator error by providing prompts during pauses for operator reconfiguration, instructions on re-positioning or change of test leads, and on interconnection of multiple test instruments of different types.

It is a fourth objective of the invention to provide a safety compliance test instrument that reduces risks associated with miscalibration by providing a warning that scheduled calibration is required.

It is a fifth objective of the invention to provide a test instrument with enhanced security features, including the ability to allow an operator to not only select a password to access system set ups, but also to enable restriction of users to partial recall of test set ups or only the test and reset functions, allowing better control and monitoring of tests and test results.

It is a sixth objective of the invention to provide a test instrument having a more flexible menu structure that enables set-up of additional tests performed by plug-in test instrument modules These objectives of the invention are achieved, in accordance with the principles of a preferred embodiment of the invention, by providing a safety compliance test instrument with a large display, soft key controls, a pause/prompt feature that enables display of instructions for re-configuring or changing test leads during pauses between tests, a calibration warning feature that warns the operator a predetermined time before calibration of the test instrument is required, and an enhanced security feature that enables input and display multiple lockout levels.

The pause/prompt, calibration warning, and enhanced security features of the preferred embodiment of the invention are each preferably accessed through softkey-controlled submenus that permit entry, respectively, of messages to be displayed during pauses in execution of control programs, a calibration alert toggle setting and number of days before calibration that the alert is to appear, and a security activation toggle setting, password entry, and security level toggle setting.

In a particularly preferred embodiment of the invention, the test instrument is a multifunction safety compliance tester of the type disclosed in U.S. Pat. No. 6,054,865, which is capable of performing insulation resistance and ground circuit tests as well as high voltage AC and DC dielectric withstand or hipot tests, and which is further arranged to receive plug-in test instrument modules that permit additional tests to be performed by the safety compliance instrument, the menu structure permitted by the preferred display enabling set-up of the additional tests performed by the plug-in test instrument modules through a single integrated menu-driven control input.

Although a particular type of safety compliance test instrument is described in detail herein, those skilled in the art will appreciate that the principles of the preferred embodiment of the invention may be applied to line leakage testers, run testers, and a variety of other test instruments capable of running multiple pre-programmed test sequences requiring multiple test lead configurations.

BRIEF DESCRIPTION OF THE DRAWINGS

FIG. 1 is a front elevation of the multifunction safety compliance tester described in U.S. Pat. No. 6,054,865.

FIG. 2 is a front elevation of the safety compliance test instrument and improved operator interface of the preferred embodiment of the invention.

FIGS. 5, 6, 7(a)–7(f), and 8(a)–8(b) are illustrations of various menus and submenus referred to in the block diagram of FIG. 4.

DETAILED DESCRIPTION OF THE PREFERRED EMBODIMENTS

Figure 3:
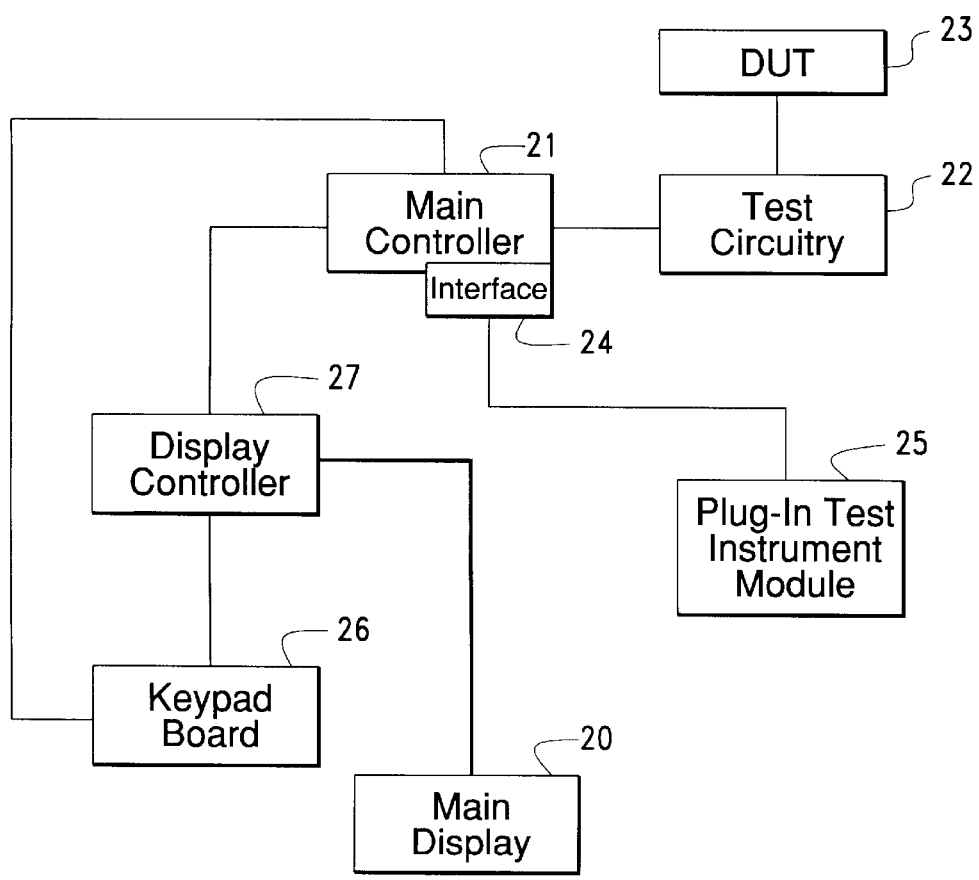
FIG. 3 is a block diagram illustrating principal components of the multifunction safety compliance test instrument illustrated in FIG. 3.

FIG. 2 illustrates the front panel of a safety compliance instrument having an improved operator interface arranged, according to the principles of a preferred embodiment of the invention, to include a display screen 20 capable of enabling operator control of such features as a calibration alert function, an improved security function, and a "prompt feature." These features are accessed through softkey-controlled pages or sub-menus that appear on the screen 20 of the safety compliance test instrument, the illustrated safety compliance test instrument operator interface including six softkeys 1–6, a standard numeric keypad 7 including up, down, left, and right cursor control keys 8, an "enter" or "input" key 9, and an "exit" key 10.

The test instrument illustrated in FIG. 2 is a type of safety compliance tester known as a "hipot" or dielectric withstand tester, which applies a high DC or AC voltage to a product and monitors for leakage currents in order to test whether insulation in the product can withstand the voltage. As a result, the front panel of the illustrated test instrument includes, in addition to the operator interface, on/off, test, and reset switches 11,12,13 and high voltage, current, and return jacks 14,15,16. As a result of the improved display screen, the illustrated test instrument does not require any LED indicators corresponding to LEDs 104 shown in FIG. 1, but the interface does include LED indicators 17 which are used to show the progress of an optional scanning function.

Aside from the improved operator interface, the safety compliance test instrument illustrated in FIG. 2 is identical to the test instrument described in U.S. Pat. No. 6,054,865, herein incorporated by reference. Because the test circuitry is essentially the same as that described in U.S. Pat. No. 6,054,865, and because the present invention relates to an operator interface or display system and not to particular test circuitry, the test circuitry is not described in detail herein. Instead, the operator interface of the invention should not be limited to a particular safety compliance test instrument, but rather may be applied to a wide variety of safety compliance test instruments utilizing numerous different hardware configuration. Nevertheless, FIG. 3 shows that the circuitry of the preferred test instrument may include a main controller 21 corresponding generally to the controller described in the U.S. Pat. No. 6,054,865, test circuitry 22 made up of power conditioning, rectifier, amplifier, and protection circuits as necessary to enable the desired tests to be performed on device under test 23, and an interface 24 for establishing a connection to a plug-in test instrument module 25. Test module 25 may include a line leakage test module, a run test module, and/or a matrix scanner. In addition, the preferred test instrument may include a keypad control board 26 and a display screen controller 27. The screen controller 27 may be in the form of a separate microprocessor connected to the main controller 21 and to the keypad control board 26, or it may be integrated into the main controller and possibly share a microprocessor.

Those skilled in the art will appreciate that numerous display control microprocessors are currently available for controlling the display and carrying out the desired display functions, as described in more detail below, and that the invention should not be limited to a particular circuit configuration or microprocessor arrangement.

Unlike the multiple function high voltage test instrument illustrated in FIG. 1 and described in the U.S. Pat. No. 6,054,865, the multiple function test instrument of the preferred embodiment of the invention includes an enlarged screen capable of displaying multiple lines of text and, optionally, graphical elements. Although the illustrated display screen is a 320×240 monographic liquid crystal display (LCD), the display screen 20 may alternatively be in the form of a color liquid crystal display, cathode ray tube (CRT), or any other display screen capable of displaying the menus and submenus described below, while the softkeys 1–6 are assigned to a memory location or register whose function depends on the menu displayed on the screen, as will be described in more detail below. Operation of softkeys is well-known in connection with displays other than those used in electrical safety compliance test instruments or equipment, as described, for example, in U.S. Pat. No. 5,321,420, herein incorporated by reference.

Figure 4:
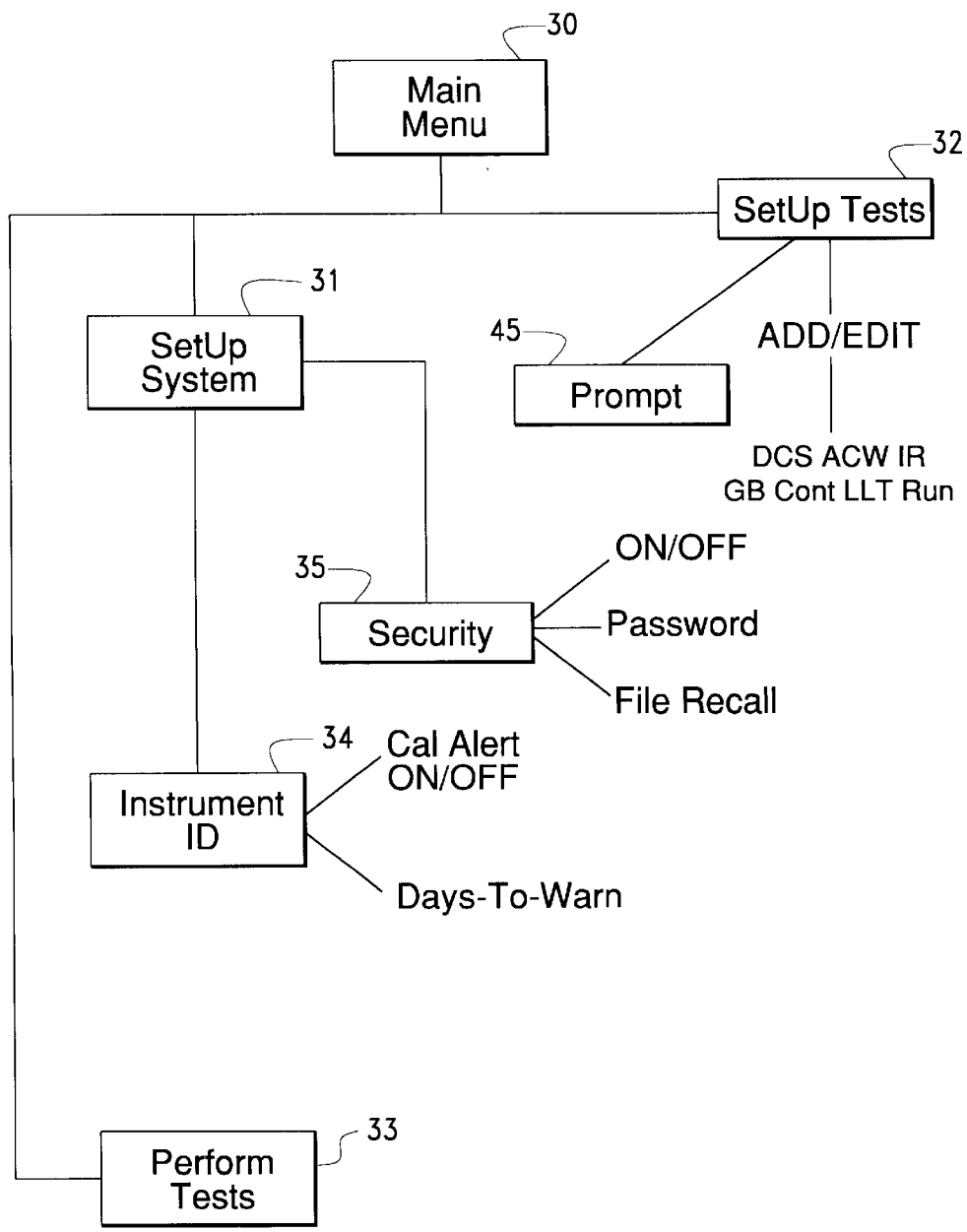
FIG. 4 is a block diagram illustrating a menu hierarchy for the display controller of the preferred embodiment of the invention.
Figure 5:
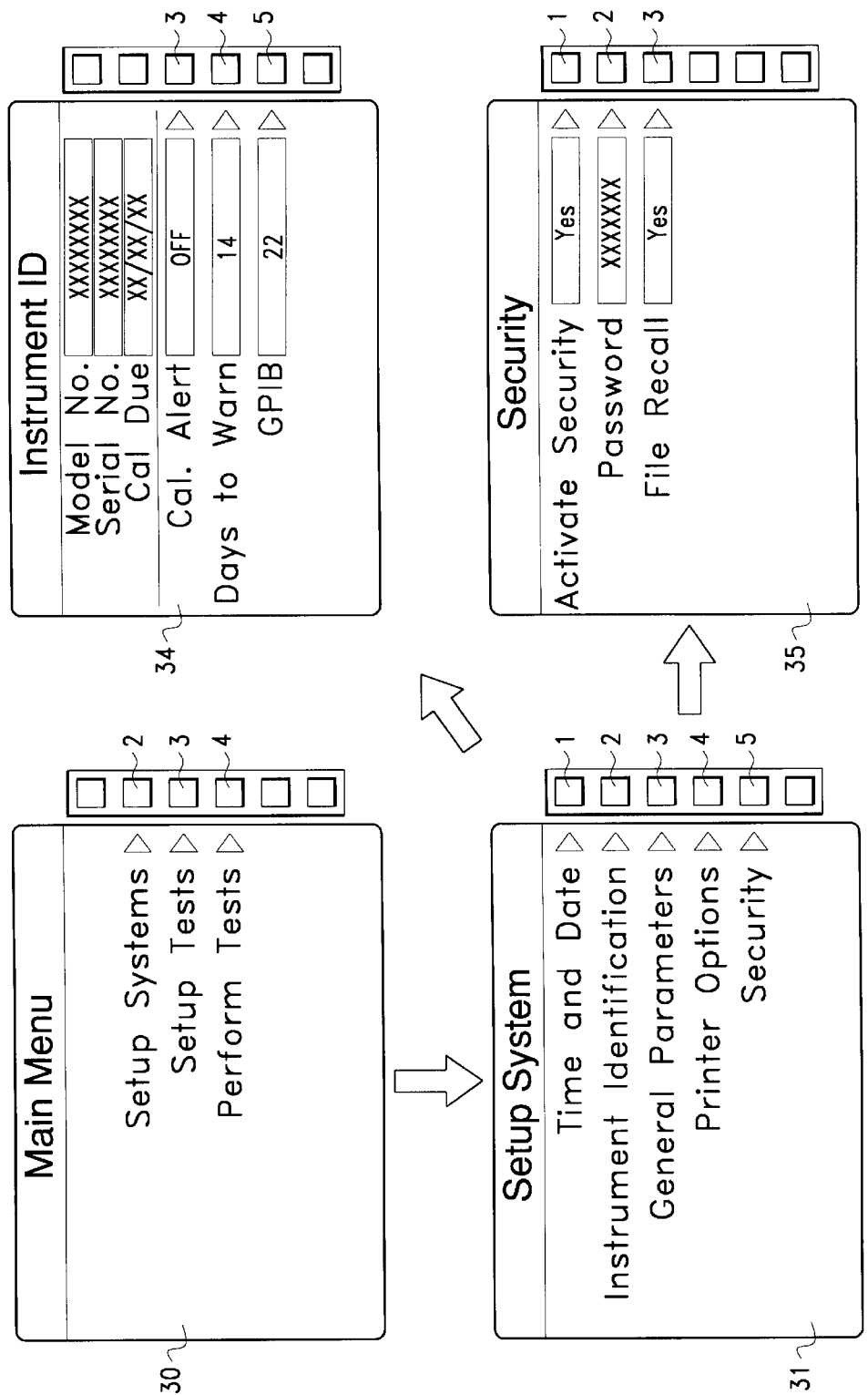

FIG. 4 is a flowchart of the various menus and submenus used to implement the enhanced operator interface of the preferred embodiment of the invention, with details of the menus and submenus being illustrated in FIGS. 5, 6, 7(a)–7(f) and 8(a)–8(b). The main menu 30, as illustrated in FIG. 5, utilizes softkeys 2–4 to enable access respective submenus 31–33 for enabling, respectively, setup or programming of system or instrument parameters, setup of individual tests, and running of individual tests. The security and calibration features are accessed through the setup system submenu 31, illustrated in FIG. 5, while the pause/prompt feature is accessed through the setup tests submenu, illustrated in FIG. 6.

Selection of the "setup system" submenu 31, as illustrated in FIG. 5, presents the operator with five options, selected through softkeys 1–5, including time and date entry, instrument identification, general parameters of the system such as alarm volume, display screen contrast, optional scanner selection, selection of a "smart" ground fault interruption (GFI) feature and the option of connecting the return jack 16 to ground. Those skilled in the art will of course appreciate that other options and features may also be accessed from this submenu, as well as from the submenus described below, and that on the other hand any of the functions or features illustrated in FIG. 5 may also be omitted or replaced depending on the requirements of the instrument in which the preferred operator interface is installed.

In the preferred embodiment of the invention, the calibration alert feature is accessed through an "instrument ID" submenu 34 which displays the model and serial numbers of the instrument, and a calibration due date. By means of this submenu, the operator is respectively presented with the option of toggling the calibration alert function between "off" and "on" using softkey 3, of inputting the number of days before the calibration due date to issue a warning using softkey 4 and the numeric keypad, and of entering a GPIB address using softkey 6 and the numeric keypad if an GPIB interface card has been installed. When the calibration alert function is toggled to on, the display will present a warning that the calibration due date is approaching a selected number of days before the actual due date, in order to ensure that the instrument is kept properly calibrated both for reasons of safety and also to ensure accurate test results.

The password protection feature is implemented using the security submenu 35 of the setup system menu 31. In this submenu, softkey 1 is used as a toggle to activate the feature, softkey 2 enables entry of a password using either the numeric keypad or a letter selection menu (described below in connection with the pause/prompt feature), and softkey 3 toggles a file recall function which provides the option of allowing the system to be set up to afford a user access to full setup, partial recall of test setups, or to prevent access to the menu display functions, leaving only the TEST and RESET functions accessible through buttons 13 and 12. Preferably, the display will present a lockout status message so that users will immediately know that they have attempted to access a restricted mode.

Figure 6:
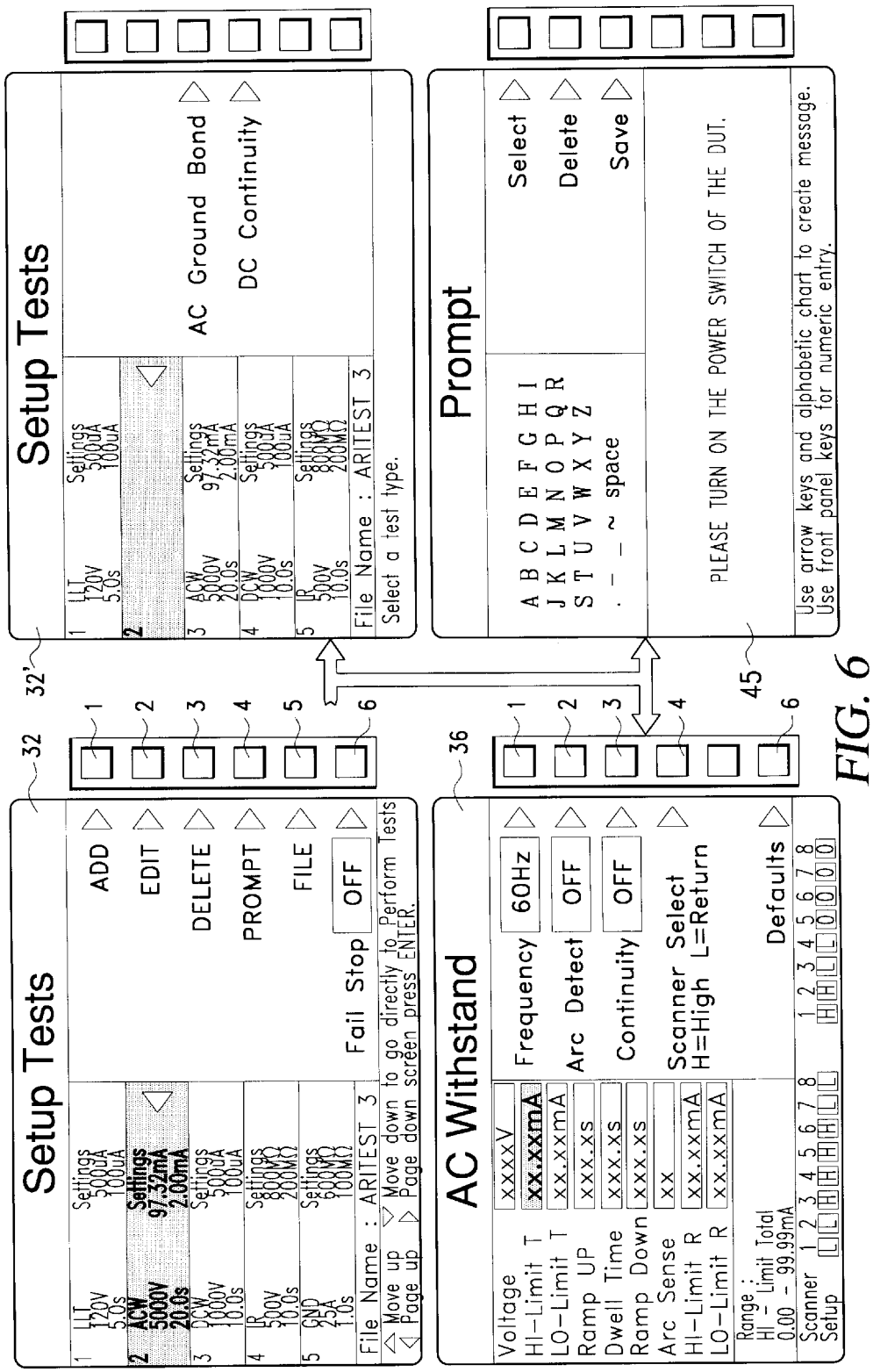

The prompt feature is accessed using the setup tests menu 32, shown in FIG. 6, which includes a listing of tests that have already been pre-programmed and that may be selected using the cursor control keys 8. The setup tests menu includes an "add" option (softkey 1), which invokes a modified setup tests menu 32' that lists tests that have not already been set up (in the illustrated example, the new tests are an AC ground bond test and a DC continuity test), and an "edit" option (softkey 2). Selection of the "add" option and a new test to be added, or selection of the "edit" option, calls up one of submenus 36–42, one of which is shown in FIG. 6 and the remainder in FIGS. 7(a)–7(f) depending on the position of the cursor in the setup tests submenu 32 or the add tests version 32' of the set up tests submenu. Also included in the setup tests menu 32 is a delete option, activated by softkey 3, the aforementioned "prompt" function, activated by softkey 4, which calls up a prompt submenu 45 also shown in FIG. 6, a file function which enables naming and saving of setup test files using an appropriate files submenu (not shown), and a fail stop option toggle for the test indicated by the current cursor position.

The setup tests submenus for the individual tests all include parameter inputs appropriate for the individual tests that the instrument is equipped or configured to perform. In the case of the AC withstand test menu illustrated in FIG. 6, the parameters that many be input using cursor keys 8 include the test voltage, upper and lower current limits, ramp-up, dwell, and ramp down times, and so forth, while softkeys 1–4 and 6 toggle various additional options, including frequency and a default settings option. All of the individual parameters and features of the respective setup test submenus illustrated in FIGS. 6 and 7(a)–7(e), including respective setup test submenus 36,37 for AC and DC dielectric withstand tests, submenu 38 for setting up an insulation resistance test, submenu 39 for setting up a DC continuity test, submenu 40 for setting up a ground bond test, and submenu 41 for setting up a line leakage test performed by a plug-in test instrument module, are described in detail in U.S. Pat. Nos. 6,054,865 and 6,011,398, and will be familiar to those skilled in the art, or at least to owners of commercially available Associated Research multiple function safety compliance instruments. The submenu 42 illustrated in FIGS. 7(f) is for an optional run test capability, and includes high and low voltage and current settings, dwell and delay time settings, high and low leakage current limit settings, high and low power limit settings, and high and low power factor limit settings.

The "prompt" menu 45, which is displayed upon pressing of softkey 4 during display of the setup tests menu 32, includes a display of alphabetic characters that may be selected, together with numbers on the numeric keypad 7, to form a message using cursor keys 8 and respective select and delete softkeys 1 and 2. The message is displayed during a pause following the test indicated by the cursor position in setup tests submenu 32, and therefore may include reminders and instructions concerning activities to be carried out by the operator during the pause, include instructions on connections to the device under test, or messages concerning safety or interpretation of test results.

The final submenu called up from the main menu 30 is the perform tests submenu 33, which enables test files to be selected using the cursor keys 8, files to be loaded using softkey 1, single step and fail stop options to be selected using softkeys 2 and 3, and results to be called up for a previously run test using softkey 4. Upon completion of a test, the results for a particular test many be displayed on a window or portion 33' of the perform tests submenu display screen. When the "results" option is selected, a display of all of the results of a complete test run can be displayed on a single screen (not shown), additional details of fewer than all of the tests may be displayed, or the results of just a single test may be displayed.

Figure 9:
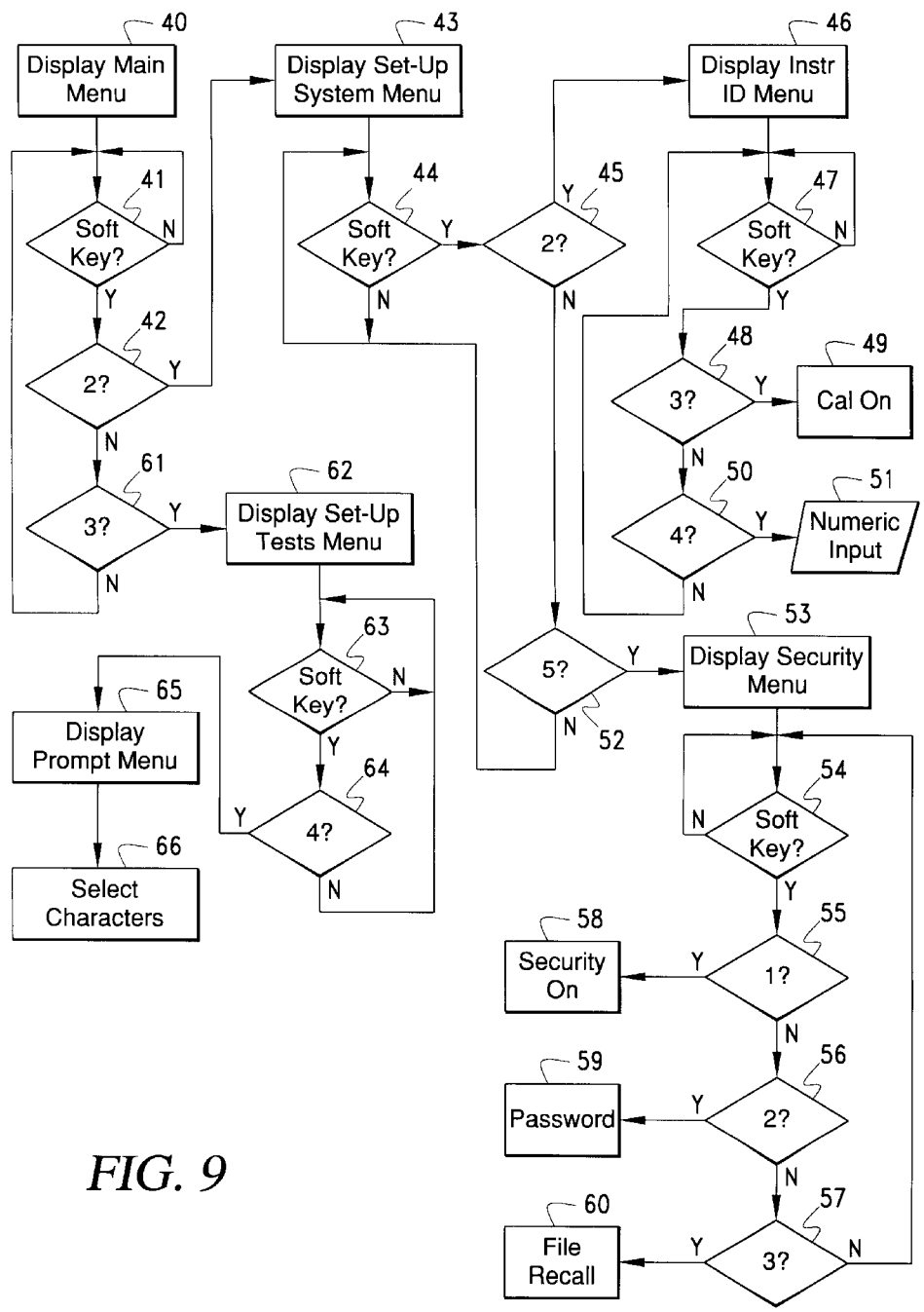
FIG. 9 is a flowchart illustrating a method of implementing the safety compliance instrument operator interface of the preferred embodiment of the invention.

FIG. 9 illustrates a method of presenting the submenus corresponding to the calibration, security, and pause/prompt features of the preferred embodiment of the invention. Following display of the main menu 30 (step 40), the display controller waits for a softkey to be pressed (step 41). If softkey 2 is determined to be pressed (step 42), then the setup system menu is displayed (step 43). If softkey 2 is then determined to be pressed (steps 44 and 45), the instrument ID menu is displayed (step 46), after which if softkey 3 is determined to be pressed (steps 47 and 48), the calibration alert function is toggled to on (step 49), while if softkey 4 is determined to be pressed (step 50), the controller waits for a numeric input of the days-to-warn function (step 51). On the other hand, if softkey 5 is determined to be pressed while displaying the setup system menu (step 52), the security menu is displayed (step 53), and if respective softkeys 1, 2, or 3 are determined to be pressed (steps 55–57), the security feature is toggled (step 58), the controller enables entry of a password (step 59), or the file recall function is set (step 60). Finally, if softkey 3 is pressed while the main menu is being displayed (step 61, the setup tests menu is displayed (step 62), and if softkey 4 is pressed from the setup tests menu (steps 63 and 64, the prompt menu is displayed (step 65), after which the display controller enables entry of the prompt message (step 66).

It will of course be appreciated by those skilled in the art that the steps illustrated in FIG. 9 are not exclusive, and that the functions and features of the preferred embodiment of the invention may be carried out in different orders using variations of the menus and submenus illustrated in FIGS. 5, 6, 7(a)–7(f), and 8(a)–8(b), that functions and features may be added or deleted, and that details of the functions and features described above may be varied depending on the nature of the safety compliance tests to be carried out by the safety compliance instrument to which the operator interface of the invention is applied.

As a result, although a preferred embodiment of the invention in sufficient detail to enable those skilled in the art to make and use the invention, it will nevertheless be appreciated that numerous variations and modifications of the illustrated safety compliance instrument and operator interface therefor may be made without departing from the spirit of the invention. As a result, it is intended that the invention not be limited by the above description or accompanying drawings, but rather that the invention be defined solely in accordance with the appended claims.

We claim:

1. An electrical safety compliance test instrument, comprising:
    a main controller;
    safety compliance test circuitry for applying an electrical signal to a device under test and for monitoring results of the test;
    a keypad including a plurality of keys;
    a display controller; and
    a display screen controlled by the display controller and having sufficient area to permit a complete set of test parameters and instructions to be displayed simultaneously, said display controller being arranged to dynamically assign values to selected ones of said plurality of keys situated adjacent said display screen and to display the key assignments on the screen adjacent to the keys to form softkeys for selecting submenus of a main menu that enables selection of types of safety compliance tests requiring different test circuits and different electrical connections to a device under test, and entry of individual parameters for the safety compliance tests.

2. The safety compliance test instrument as claimed in claim 1, wherein said submenus include a pause/prompt submenu arranged to enable entry of a message to be displayed between tests in order to remind an operator of tasks to be performed during manual configuration of the test instrument, leads, or probes during a pause between tests.

3. The safety compliance test instrument as claimed in claim 1, wherein said submenus include a submenu that enables selection of an autocalibration alert function to alert the operator that the instrument requires calibration.

4. The safety compliance test instrument as claimed in claim 1, further comprising a security submenu that enables the operator to select a password to access system setups, and further to select from among a plurality of security level options.

5. The safety compliance test instrument as claimed in claim 4, wherein said security level options permit a user to access full system setups, partial recall of test setups, or only test and reset functions of the safety compliance test instrument.

6. The safety compliance test instrument as claimed in claim 1, wherein said safety compliance test instrument is arranged to receive plug-in test instrument modules, and wherein said menus include menus for controlling additional tests performed by said plug-in test instrument modules.

7. The safety compliance test instrument as claimed in claim 1, wherein said safety compliance test instrument is a multiple function dielectric withstand tester.

8. The safety compliance test instrument as claimed in claim 7, wherein said dielectric withstand tester is arranged to perform AC and DC dielectric withstand tests, insulation resistance tests, and ground bond tests, and wherein said display controller is arranged to display submenus for inputting test parameters for each of said tests.

9. The safety compliance test instrument as claimed in claim 8, wherein said display controller is further arranged to display submenus for inputting line leakage test parameters and/or run test parameters to facilitate set-up of additional tests performed by plug-in test instrument modules.

10. An operator interface method for an electrical safety compliance test instrument, comprising the steps of:
    providing a display screen controlled by the display controller and having sufficient area to permit a complete set of test parameters and instructions to be displayed simultaneously;
    displaying a main menu;
    dynamically assigning values to selected ones of said plurality of keys situated adjacent said display screen to form softkeys for selecting submenus of said main menu to enable selection of types of safety compliance tests and entry of individual parameters for the safety compliance tests;
    reconfiguring safety compliance test circuits based on said selection; and
    selecting from among a plurality of different possible electrical connections to a device under test based on instructions displayed on said screen.

11. A method as claimed in claim 10, wherein said submenus include a pause/prompt submenu arranged to enable entry of a message to the displayed between tests in order to remind an operator of tasks to be performed during manual configuration of the test instrument, leads, or probes during a pause between tests.

12. A method as claimed in claim 10, wherein said submenus include a submenu that enables selection of an autocalibration alert function to alert the operator that the instrument requires calibration.

13. A method as claimed in claim 10, wherein said submenus include a security submenu that enables the operator to select a password to access system setups, and further to select from among a plurality of security level options.

14. The safety compliance test instrument as claimed in claim 13, wherein said security level options permit a user to access full system setups, partial recall of test setups, or only test and reset functions of the safety compliance test instrument.

15. A method as claimed in claim 10, wherein said safety compliance test instrument is arranged to receive plug-in test instrument modules, and wherein said menus include menus for controlling additional tests performed by said plug-in test instrument modules.

16. A method as claimed in claim 10, wherein said submenus include submenus enabling entry of parameters for AC and DC dielectric withstand tests, insulation resistance tests, and ground bond tests.

17. A method as claimed in claim 16, wherein said submenus include submenus for in putting line leakage test parameters and/or run test parameters to facilitate set-up of additional tests performed by plug-in test instrument modules.

* * * * *